United States Patent
Mantz et al.

(10) Patent No.: US 8,368,019 B2
(45) Date of Patent: Feb. 5, 2013

(54) PARTICLE BEAM SYSTEM

(75) Inventors: Hubert Mantz, Aalen (DE); Rainer Arnold, Ulm (DE); Michael Albiez, Aalen (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 13/247,979

(22) Filed: Sep. 28, 2011

(65) Prior Publication Data

US 2012/0025077 A1 Feb. 2, 2012

Related U.S. Application Data (63) Continuation of application No. 12/658,476, filed on Feb. 8, 2010, now abandoned.

(51) Int. Cl.
H01J 37/26 (2006.01)
H01J 37/244 (2006.01)
H01J 37/10 (2006.01)

(52) U.S. Cl. ............. 250/310; 250/396 R; 250/396 ML; 250/397; 250/370.01

(58) Field of Classification Search .................. 250/310, 250/396 R, 396 ML, 397, 370.01
See application file for complete search history.

(56) References Cited

U.S. PATENT DOCUMENTS

| | | | |
|---|---|---|---|
| 3,030,512 A | 4/1962 | Harker | |
| 3,100,261 A | 8/1963 | Bigelow | |
| 3,204,095 A | 8/1965 | Watanabe | |
| 5,525,806 A | 6/1996 | Iwasaki et al. | |
| 5,847,388 A | 12/1998 | Foote et al. | |
| 5,903,004 A | 5/1999 | Koshihara et al. | |
| 5,943,388 A | 8/1999 | Tuemer | |
| 6,855,938 B2 | 2/2005 | Preikszas et al. | |
| 7,825,386 B2 * | 11/2010 | Liu et al. | 250/396 ML |
| 2002/0024014 A1 | 2/2002 | Kazumori | |
| 2002/0179864 A1 | 12/2002 | Fielden et al. | |
| 2003/0089852 A1 | 5/2003 | Ochiai et al. | |
| 2003/0189172 A1 | 10/2003 | Sawahata et al. | |
| 2005/0184251 A1 | 8/2005 | Oi et al. | |
| 2006/0138325 A1 | 6/2006 | Choi | |
| 2007/0104320 A1 | 5/2007 | Arenson et al. | |
| 2007/0215802 A1 | 9/2007 | Ward et al. | |
| 2007/0228287 A1 | 10/2007 | Ward et al. | |
| 2011/0031215 A1* | 2/2011 | Mantz et al. | 216/60 |
| 2012/0025078 A1* | 2/2012 | Mantz et al. | 250/310 |

FOREIGN PATENT DOCUMENTS

| | | |
|---|---|---|
| DE | 697 09 307 T2 | 6/2002 |
| DE | 10 2005 061 663 A1 | 7/2007 |
| DE | 10 2009 024 928 A1 | 10/2010 |
| EP | 0 865 662 B1 | 12/2001 |

(Continued)

OTHER PUBLICATIONS

Extended European Search Report dated May 11, 2012 in European Patent Application No. 10 001 335.8.

(Continued)

*Primary Examiner* — Nikita Wells
(74) *Attorney, Agent, or Firm* — Bruce D. Riter (57) ABSTRACT

A particle beam system comprises a particle beam source 5 for generating a primary particle beam 13, an objective lens 19 for focusing the primary particle beam 13 in an object plane 23; a particle detector 17; and an X-ray detector 47 arranged between the objective lens and the object plane. The X-ray detector comprises plural semiconductor detectors, each having a detection surface 51 oriented towards the object plane. A membrane is disposed between the object plane and the detection surface of the semiconductor detector, wherein different semiconductor detectors have different membranes located in front, the different membranes differing with respect to a secondary electron transmittance.

20 Claims, 5 Drawing Sheets

FOREIGN PATENT DOCUMENTS

| | | |
|---|---|---|
| EP | 1227315 A2 | 12/2001 |
| EP | 2105944 A1 | 3/2008 |
| GB | 899 291 A | 6/1962 |
| GB | 2295454 A | 5/1996 |
| JP | 56153656 A | 11/1981 |
| JP | 57069655 A | 4/1982 |
| JP | 03216581 A | 9/1991 |
| JP | 06283132 A | 10/1994 |
| JP | 2003 217 497 A | 7/2003 |
| WO | 8103707 | 12/1981 |
| WO | 2008 051 880 A2 | 5/2008 |
| WO | 2008 051 937 A2 | 5/2008 |
| WO | 2010115873 A1 | 10/2010 |

OTHER PUBLICATIONS

Partial European search report dated Sep. 15, 2011 from European patent application No. 10 008 253.6.

A.R. Wilson et al., "Backscattered electron effects in a high-angle EDXS", Journal of Physics E. Scientific Instruments, IOP Publishing, Bristol, GB, vol. 22, No. 9, Sep. 1, 1989, pp. 726-729.

R. Cossio et al., "Improvements in trace element detection in energy dispersive spectrometry using an X-ray filter (FEDS) and applications to petrological problems", Microchimica Acta, An International Journal on Micro and Traceanalysis, Springer-Verlag, VI, vol. 161, No. 3-4, Dec. 20, 2007, pp. 337-342.

R.T. Murray, "A filter to remove backscattered electrons for energy-dispersive analysis in a scanning microscope", Journal of Physics E. Scientific Instruments, IOP Publishing, Bristol, GB, vol. 12, No. 12, Dec. 1, 1979, p. 1141.

M. Schaffer et al., "Automated three-dimensional X-ray analysis using a dual-beam FIB", Ultramicroscopy, Elsevier, Amsterdam, NL, vol. 107, No. 8, Apr. 21, 2007, pp. 587-597.

W. Drzazga et al., "Three-dimensional characterization of microstructures in a SEM", Measurement Science and Technology, IOP, Bristol, GB, vol. 17, No. 1, Jan. 1, 2006, pp. 28-31.

Wlodzimierz Drzazga et al., "Three-dimensional characterization of microstructures in a SEM", Measurement Science and Technology 17 (2006), pp. 28-31.

L. Reimer, "Scanning Electron Microscopy", Optical Sciences, Physics of Image Formation and Microanalysis, Second Edition, Springer (1998), Sections 10.1 & 10.2, pp. 379-407.

Lowe B G Ed—Eds : David B Williams et al: Chapter 2: Problems and Trends in X-Ray Detector Design for Microanalysis: Jan. 1, 1995, X-Ray Spectrometry in Electron Beam Instruments, Plenum Press, pp. 7-19, XP009136042 ISBN: 978-0-306-44858-4.

Extended European search report dated Dec. 7, 2011 from European patent application No. 10 008 253.6.

P.R. Munroe et al., "The application of focused ion beam microscopy in the material sciences", Materials Characterization, Elsevier, New York, US, vol. 60, No. 1, Jan. 1, 2009, pp. 2-13.

* cited by examiner

PARTICLE BEAM SYSTEM

CROSS-REFERENCES TO RELATED APPLICATIONS

This application is a continuation of U.S. application Ser. No. 12/658,476 filed 8 Feb. 2010.

This application is related to U.S. patent application Ser. No. 12/806,111 filed 5 Aug. 2010.

The present application claims priority of German Patent Application. No. 10 2009 008 063.5, filed Feb. 9, 2009, entitled "PARTICLE OPTICAL SYSTEM", the contents of which are hereby incorporated by reference in their entirety.

FIELD OF THE INVENTION

The invention relates to a particle beam system having a particle beam source for generating a primary particle beam and an electron detector and an X-ray detector.

BACKGROUND OF THE INVENTION

A conventional particle microscope comprises a particle beam source for generating a primary particle beam and an electron detector. The particle microscope can be an electron microscope having an electron beam source as its particle source, and the particle microscope can be an ion microscope having an ion source as its particle source. Some conventional electron microscopes include an X-ray detector for detecting X-rays generated by the primary electron beam at an inspected object. An energy spectrum of such X-rays may comprise characteristic lines indicative of elements included in the object. An analysis of the X-rays may comprise an analysis with respect to energy of detected X-rays. One example of such analysis is an analysis commonly referred to as Energy Dispersive X-ray Spectroscopy (EDX).

A conventional electron microscope including an X-ray detector is known from US 2006/0138325 A1. The X-ray detector of this microscope receives X-rays originating from an object and generated at the object by a primary electron beam focused onto the object. Since the primary electron beam also generates secondary electrons, which should not be detected by the X-ray detector, the X-ray detector comprises an electron trap to prevent secondary electrons from generating detection signals in the X-ray detectors. Such detection signals generated by secondary electrons could be erroneously interpreted as X-ray signals in a subsequent analysis. The electron trap may comprise a magnetic electron trap.

A detection efficiency for X-rays has been perceived as being too low in conventional electron microscopes including an X-ray detector. This perceived lack of efficiency applies in particular in a situation where the primary electron beam has a low energy.

SUMMARY OF THE INVENTION

The invention has been accomplished taking the above problems into consideration.

Embodiments of the invention provide a particle beam system comprising a particle beam source, an electron detector and an X-ray detector having a relatively simple configuration. Other embodiments of the invention provide a particle beam system comprising a particle beam source, an electron detector and an X-ray detector having an improved performance with respect to X-ray detection.

According to embodiments, a particle beam system comprises a particle beam source configured to generate a primary particle beam, an objective lens configured to focus the primary particle beam in an object plane, an X-ray detector having at least two semiconductor detectors, wherein each of the semiconductor detectors has a detection surface oriented towards an object disposed in the object plane for inspection, and wherein a membrane or window is located between the object and the detection surface of the respective detector. The membranes located in front of the at least two semiconductor detectors differ with respect to a transmittance for secondary electrons.

The X-ray detector does not comprise any magnetic electron traps. The inventors found that magnetic electron traps of an X-ray detector located close to an objective lens of an electron microscope may disturb electromagnetic fields generated by the objective lens for focusing the primary electron beam. Such disturbance of the electromagnetic fields generated by the objective lens may affect the focusing of the primary electron beam, which may finally reduce a performance of the system.

In the X-ray detector according to the embodiment, secondary electrons may penetrate the membrane provided in front of the semiconductor detector such that they generate detection signals in the semiconductor detector and are detected accordingly. However, since two different membranes are provided which differ with respect to their transmittance for secondary electrons, different amounts of secondary electrons will penetrate the membranes such that different amounts of detection signals will be generated which originate from detection events triggered by electrons. It is thus possible to determine an amount of detection events caused by electrons for at least one of the semiconductor detectors. A remaining amount of detection events not caused by electrons will then represent an amount of detected X-ray events. It is thus possible to obtain a relatively accurate detection of X-ray amounts without having to use a magnetic electron trap, for example.

According to a further embodiment, the X-ray detector comprises a ring structure surrounding a beam path of the primary particle beam, wherein the ring structure carries at least two semiconductor detectors such that detection surfaces of the semiconductor detectors are oriented towards an object plane of the objective lens. According to exemplary embodiments herein, the IP-ray detector comprises more than two semiconductor detectors, such as, for example, three, four, eight or more semiconductor detectors. According to some embodiments, the detection surfaces of the plural semiconductor detectors may be arranged in a common plane. According to other embodiments, the semiconductor detectors and the detection surfaces thereof may be shaped as sectors, such that the plural detection surfaces together substantially fill a circular surface having a central aperture allowing the primary particle beam to traverse the X-ray detector.

According to further embodiments, a particle beam system comprises a particle source for generating a primary particle beam, an objective lens for focusing the primary particle beam in an objective plane, an electron detector for detecting electrons originating from an inspected object, and an X-ray detector including a first semiconductor detector having a detection surface oriented towards the object plane. The particle beam system may further comprise an actuator and a first membrane, wherein the actuator is configured to move the first membrane back and forth between a first position and a second position, wherein the membrane is disposed between the semiconductor detector and the object plane when it is located in the first position, and wherein the first membrane is not located between the semiconductor detector and the object plane. When the first membrane is not located between the semiconductor detector and the object plane, X-rays generated by the primary particle beam at the object can be incident on the detection surface of the semiconductor detector without having to traverse the membrane. On the other hand, when the first membrane is located between the semiconductor detector and the object plane, X-rays generated by the primary particle beam at the object have to traverse the membrane to reach the detection surface of the semiconductor.

The first membrane which can be selectively disposed between the first semiconductor detector and the object plane has a transmittance for electrons which is smaller than 1. It is both possible to vary a detection sensitivity for secondary electrons of the semiconductor detector by placing the first membrane in front of the semiconductor detector and by removing the membrane from its position in front of the semiconductor detector. Similar to the embodiment having two different membranes located in front of two different semiconductor detectors, it is thus possible to perform two subsequent measurements of detection events, wherein the two measurements differ with respect to the transmittance for electrons. From these two measurements it is possible to determine an amount of detection events caused by X-rays with a relatively high accuracy.

According to an exemplary embodiment herein, a second membrane is provided which is also coupled to the actuator, wherein the second membrane is positioned in front of the semiconductor detector when the first membrane is not positioned in front of the semiconductor detector, and vice versa.

BRIEF DESCRIPTION OF THE DRAWINGS

The forgoing as well as other advantageous features of the invention will be more apparent from the following detailed description of exemplary embodiments of the invention with reference to the accompanying drawings. It is noted that not all possible embodiments of the present invention necessarily exhibit each and every, or any, of the advantages identified herein.

DETAILED DESCRIPTION OF EXEMPLARY EMBODIMENTS

In the exemplary embodiments described below, components that are alike in function and structure are designated as far as possible by alike reference numerals. Therefore, to understand the features of the individual components of a specific embodiment, the descriptions of other embodiments and of the summary of the invention should be referred to.

Figure 1:
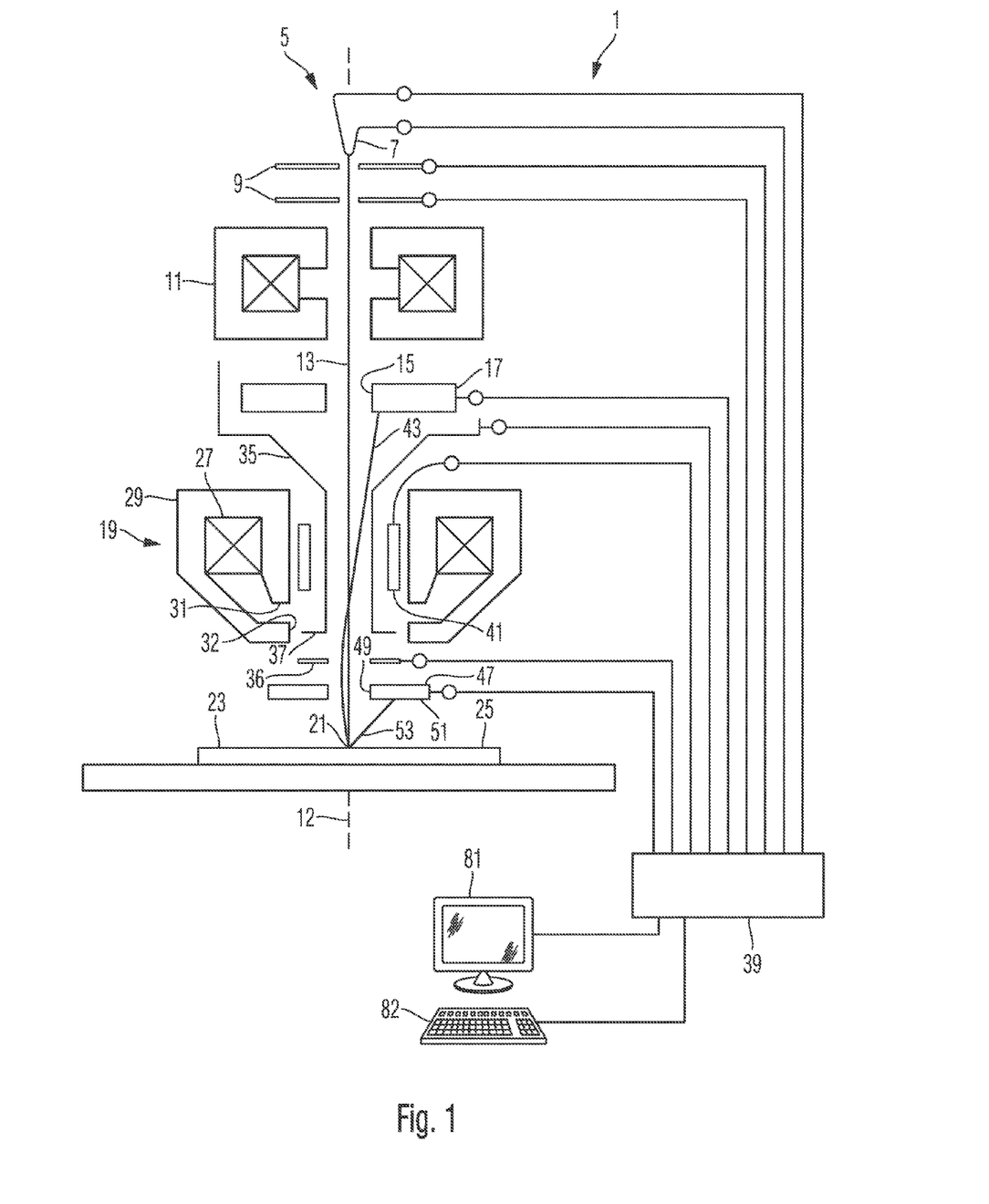
FIG. 1 is a schematic illustration of a particle beam system.

FIG. 1 is a schematic illustration of an exemplary embodiment of a particle beam system 1. The particle beam system 1 comprises an electron beam source 5 having a cathode 7 and extractor and suppressor electrodes 9 for generating a primary particle beam 13. The primary particle beam 13 traverses a condenser lens 11, an aperture 15 provided in an electron detector 17, and an objective, lens 19 for focusing the primary particle beam 13 at a location 21 in an object plane 23. A surface of an object 25 to be inspected is disposed in the object plane 25.

The objective lens 19 comprises a ring coil 27 provided in a ring-shaped yoke having a ring-shaped upper pole piece 31 and a ring-shaped lower pole piece 32 such that a ring-shaped gap is formed between the upper and lower pole pieces 31, 32. A magnetic field for generating the electron beam 13 is generated in this gap.

The particle beam system 1 further includes a beam tube 35 which enters and partially traverses the objective lens 19. An end electrode 37 is provided at a bottom end of the beam tube 35. A terminal electrode 36 is disposed between the end electrode 37 and the object plane, wherein an electrostatic field generated between the end electrode 37 and terminal electrode 36 provides a focusing power on the primary electron beam 13. The focusing power provided by the electrostatic field between the electrodes 36 and 37 and the focusing power provided by the magnetic field between the pole pieces 31 and 32 commonly provide the focusing power of the objective lens 19 of the particle beam system 1.

A controller 39 is provided for supplying suitable voltages to the terminal electrode 36, the end electrode 37, the cathode 7 and the extractor and suppressor electrodes 9 such that an electron beam focus is formed in the object plane.

These voltages can be selected such that the electrons of the primary electron beam have a predetermined kinetic energy when they are incident on the object 25 at location 21. It is in particular possible that the controller 39 supplies a voltage corresponding to ground potential or a voltage differing from ground potential to the terminal electrode 36.

The objective lens 19 further includes deflectors 41 which are also controlled by the controller 39 for deflecting the electron beam 13 and for varying the location 21 at which the primary electron beam 13 is incident, on the object 25 in the object plane 23. By deflecting the primary electron beam it is in particular possible to systematically scan the primary particle beam across a portion of the surface of the object 25.

The primary particle beam incident, on the object 25 results in that secondary electrons emerge from the object 25. A portion of such secondary electrons may enter into the beam tube 35 such that they are detected by lee electron detector 17. In the context of the present application, the term secondary electrons comprises all types of electrons which are caused to emerge from the object by directing the primary particle beam onto the object and which can be detected by the electron detector 17. The term secondary electrons in particular includes backscattered electrons having a kinetic energy which corresponds to or is somewhat smaller than the kinetic energy of the primary particles incident on the object. The term further includes secondary electrons having, when they emerge from the surface of the object, a kinetic energy which is substantially smaller than the kinetic energy of the primary particles upon their incidence onto the object. FIG. 1 schematically shows an exemplary trajectory of a secondary electron which is incident on the electron detector 17 at reference numeral 43.

The particle beam system 1 further comprises an X-ray detector 47 disposed in between of the objective lens 19 and the object plane 23. The X-ray detector 47 comprises a central aperture 49 allowing the primary particle beam 13 and secondary electrons 43 to traverse the X-ray detector 47. The X-ray detector 47 comprises plural detection surfaces 51 for X-ray detection, wherein the plural detection surfaces 51 are located at a radial distance from a main axis 12 of the objective lens. The X-ray detector 47 is provided for detecting X-rays generated by the primary particle beam 13 incident on the object. An exemplary trajectory of an X-ray generated by the primary electron beam 13 at location 21 and incident, on the X-ray detector 47 is indicated in FIG. 1 at reference numeral 53.

Figure 2:
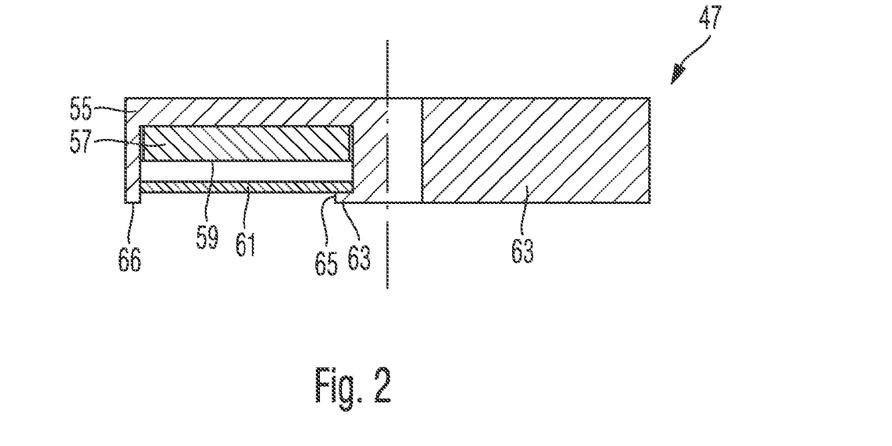
FIG. 2 is a sectional view along a line II-II in FIG. 3 of an X-ray detector of the particle beam system shown in FIG. 1.
Figure 3:
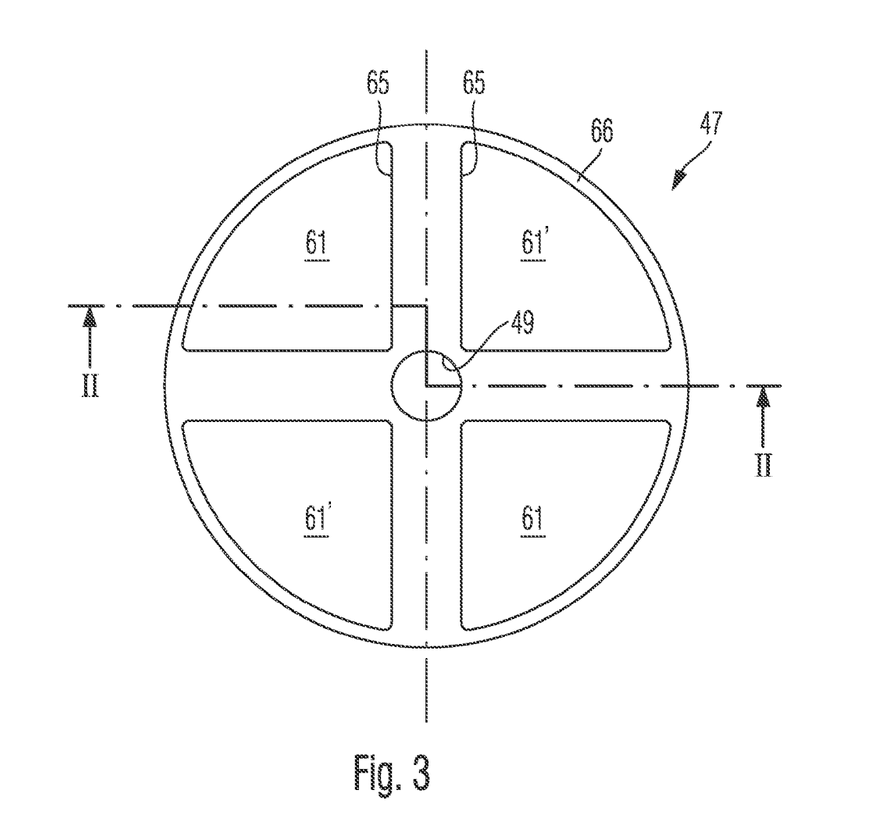
FIG. 3 is an elevational view of a bottom of the X-ray detector shown in FIG. 2.

A configuration of the X-ray detector 47 is illustrated as a sectional view in FIG. 2 and as an elevational view in FIG. 3. The X-ray detector 47 comprises a ring-shaped carrier including an upper plate 55 having a central bore for providing the aperture 49 allowing the primary particle beam 13 and the secondary electrons 43 to pass through. Four semiconductor detectors are attached to a bottom surface of plate 55 such that a detection surface 59 of each semiconductor detector 57 is oriented towards the object plane 23. A membrane or window 61 is mounted in front of the detection surface 59 of each semiconductor detector 57. The membranes 61 have a function to at least partially prevent incidence of secondary electrons on the detection surfaces 59 of the semiconductor detectors 57. In the exemplary embodiment shown in FIG. 2, the membrane 61 is disposed at a small distance from the detection surface 59. It is, however, also possible that the membrane contacts or is directly attached as a membrane layer to the detection surface of the semiconductor detector and such that the membrane is carried by the semiconductor detector.

The membranes 61 can be configured such that they are not fixedly attached to the semiconductor detector or the ring structure such that they can be readily removed and replaced by other membranes. The exemplary embodiment shown in FIGS. 2 and 3 has axial projections 63 provided on the plate 55. The projections 63 include radially extending portions 65 adapted to carry the membranes 61 such that they are mounted on the X-ray detector 47. For example, the membranes 61 can be clamped between the radial projections 65 and an outer axial ring-shaped projection 66 provided on the plate 55.

In the embodiment shown in FIGS. 2 and 3, the X-ray detector 57 comprises four separate semiconductor detectors arranged in a configuration of four quadrants distributed around the aperture 49. The four semiconductor detectors 57 each have a same configuration and same properties, and detection signals of the four semiconductor detectors 57 are separately received by the controller 39.

The four membranes 61 arranged in front of the detection surfaces 59 of the four semiconductor detectors have different properties. Two different types of membranes are provided. Two membranes which are indicated by reference numeral 61 in FIG. 3 have a transmittance for secondary electrons which is greater than a transmittance for secondary electrons of the two other membranes which are indicated in FIG. 3 with reference numeral 61'.

The two different types of membranes having different transmittances for secondary electrons are provided to reduce a detection efficiency for secondary electrons of the X-ray detector, while a detection efficiency for X-rays is not substantially reduced. The membranes having the differing transmittances for secondary electrons can be in particular used for determining an amount of detected secondary electrons and to determine a remaining amount of detected X-rays. This may improve an accuracy of X-ray detection.

The membranes 61 are made from a material including elements having a low atomic number such that a transmittance for X-rays is high. All membranes can be made from the same material and have different thicknesses for providing the different transmittances for secondary electrons. The membranes can be made of polyester, for example. Examples of suitable polyesters include terephtalat-polyester, such as polyethylenterephtalat-polyester. Suitable membranes can be obtained from the company DuPont, Wilmington, USA under the product name Mylar. Suitable thicknesses of the membranes can be for example, within a range from 0.1 μm to 50 μm, and in particular from 1.0 μm to 10 μm. Other suitable membranes can be obtained from the company MoxTek, Orem, USA under the product name AP3.3. Still further membranes can be made of beryllium, for example.

In an exemplary embodiment illustrated with reference to FIGS. 4 and 5 below, a membrane having the greater transmittance for electrons is provided by a foil having a thickness of 1 μm made of the material AP3.3, and a membrane having a lower transmittance for electrons is made of a foil of a thickness of 6 μm of the material Mylar.

Figure 4:
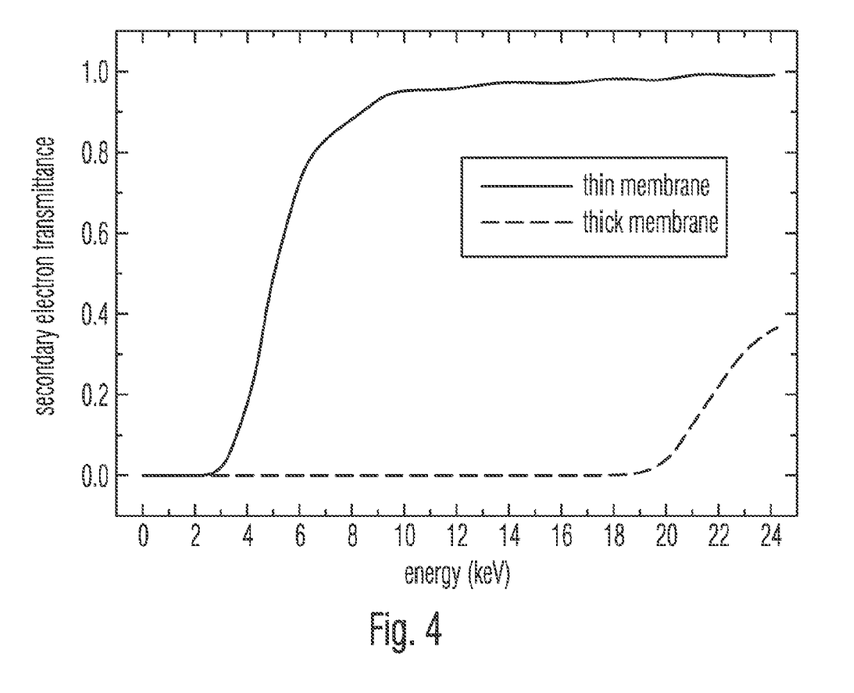
FIG. 4 is a graph illustrating a transmittance for electrons of membranes of the X-ray detector shown in FIGS. 2 and 3.

FIG. 4 shows a graph representing transmittances for electrons in dependence on kinetic energy of the electrons for the two membranes obtained by numerical simulation.

Figure 5:
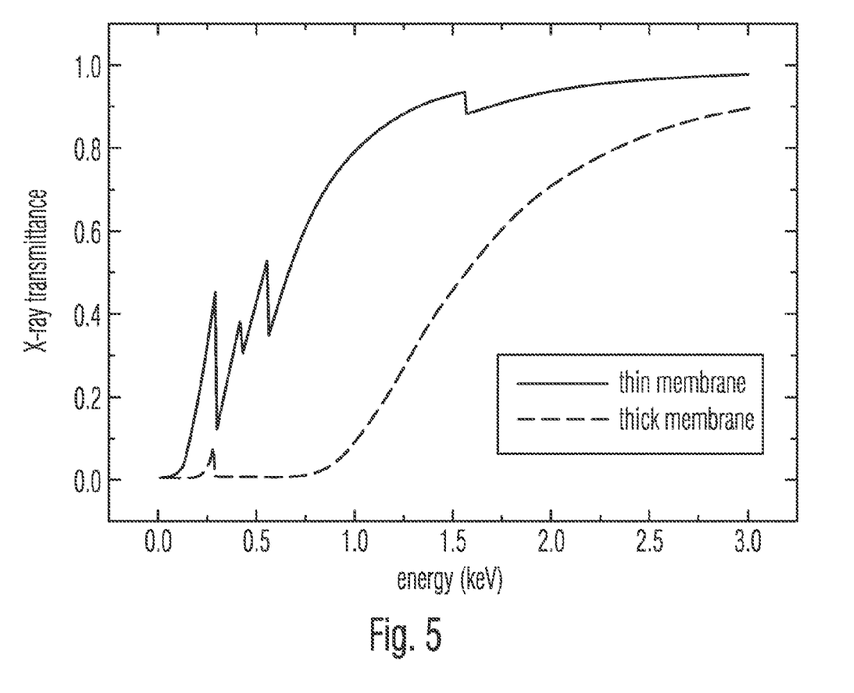
FIG. 5 shows a graph illustrating a transmittance for X-ray radiation of the membranes of the X-ray detector shown in FIGS. 2 and 3.

FIG. 5 shows a graph representing transmittances for X-rays in dependence on kinetic energy of the electrons for the two membranes obtained by numerical simulation.

In the example illustrated with reference to FIG. 6 below, a membrane having the greater transmittance for electrons is provided by a foil of a thickness of 1 μm of Mylar material, and a membrane having the smaller transmittance for electrons is provided by a foil having a thickness of 6 μm of the same Mylar material.

Figure 6:
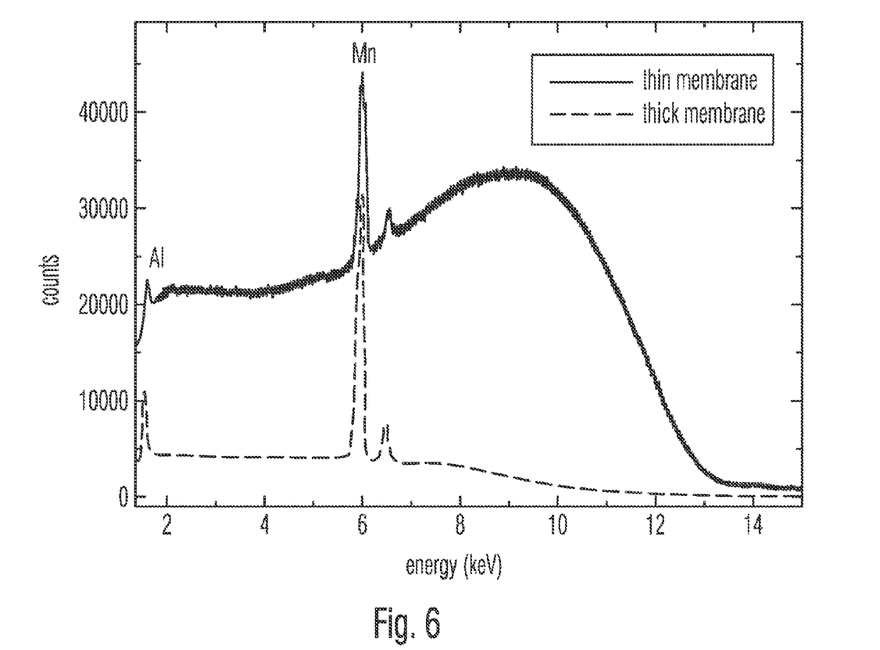
FIG. 6 shows a graph illustrating or rates detected by the X-ray detector shown in FIGS. 2 and 3.

FIG. 6 shows graphs representing count rates measured in an experiment using the semiconductor detectors 47 of the particle beam system 1 shown in FIG. 1. In this experiment, the primary particle beam is directed onto a sample made of manganese (Mn). The graphs shown in FIG. 6 illustrate a number of detection events recorded in a given time by the semiconductor detector having the thin foil located in front of it and a number of detection events recorded at the given time by the semiconductor detector having the thick foil located in front of it. Each graph is plotted in dependence on a kinetic energy of primary particles incident on the sample. From FIG. 6 it appears that the count rates for the thin membrane and for the thick membrane differ with respect to their dependency on energy such that it is possible by a further analysis to derive additional information from the detection signals. It is in particular possible to determine an amount of detection signals caused by detected X-rays.

In the example illustrated above, the X-ray detector comprises four separate semiconductor detectors. It is, however, also possible to use a number of semiconductor detectors which differs from four. Two, three, five, six or more semiconductor detectors can be used, for example. Two different types of membranes having different transmittances for secondary electrons are used in the exemplary embodiment illustrated above. It is, however, also possible to use a higher number of membranes having different transmittances for secondary electrons. For example, three or more membranes having different transmittances for secondary electrons can be used.

Detection signals generated by the semiconductor detectors 57 and detection signals generated by the electron detectors 17 are supplied to the controller 39. Electron microscopic images can be generated from the detection signals of the semiconductor detectors and from the detection signal of the electron detector. This can be achieved by controlling the deflectors 41 such that the primary particle beam 13 is scanned to different locations 21 on the sample 25 and by recording detected intensities in correspondence with the respective locations. The obtained images can be displayed on a monitor 81, and a controller 39, which may comprise a computer, can be controlled by a suitable input device, such as a keyboard 82. The controller may include a module to analyze the varying detection signals. In particular, the detection signals obtained from the semiconductor detector having the membrane 61 located in front of it and the detection signals from the semiconductor detector having the membrane 61 located in front of it, and the detection signals obtained from the electron detector 17 can be compared and analyzed relative to each other for obtaining derived measurement values from the detection signals. Such derived measurement values can also be displayed in dependence on the respective locations 21 as images.

Figure 7:
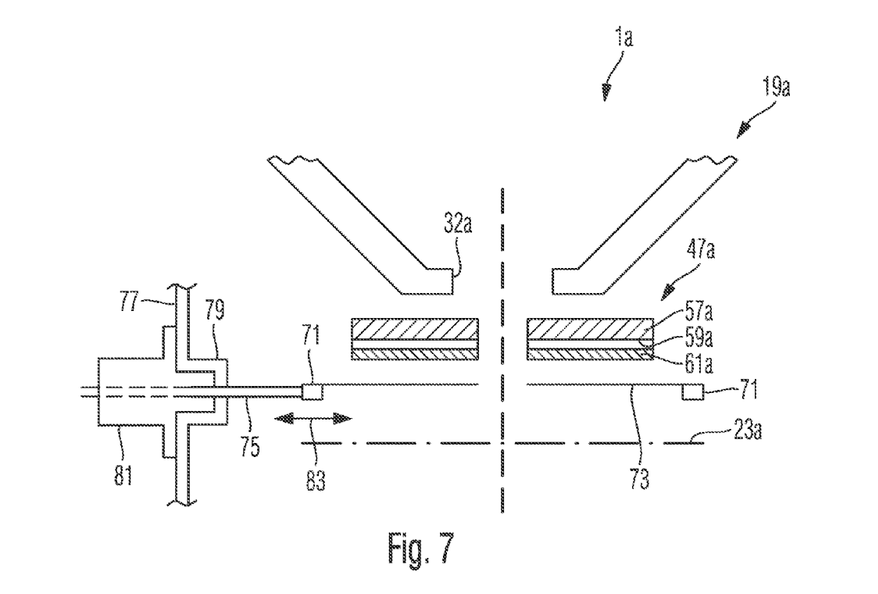
FIG. 7 is a schematic illustration of a portion of a particle beam system.

FIG. 7 shows a further example of a particle beam system. The particle beam system 1a shown in FIG. 7 has a similar configuration as the particle beam system illustrated above with reference to FIGS. 1 and 6. The particle beam system 1a again comprises an objective lens 19a having an X-ray detector 47a located in front of it. The X-ray detector 47a comprises a semiconductor detector 57 having a detection surface, wherein a membrane 61a is located in front of the detection surface and between the detection surface and an object plane of the objective lens 19a. A membrane 73 is mounted on a ring-shaped carrier 71 provided between the X-ray detector 47a and the object plane 23a. The carrier 71 is mounted on a rod 75 extending through a wall 77 defining a vacuum space in which the objective lens 19a is arranged. A motor 81 is provided as an actuator which is controlled by a controller not shown in FIG. 7 and corresponding to controller 39 shown in FIG. 1. The rod 75 can be displaced back and forth in a longitudinal direction of the rod 75 by operating the actuator 81, as indicated by a double arrow 83 in FIG. 7. It is thus possible to arrange the membrane 73 in a first position in front of the detector 47a, and to arrange the membrane in a second position in which it is not disposed between the detector 47a and the object plane 23. In the first and second positions, the membrane 73 provides different transmittances for electrons such that it is possible to change a detection characteristic of the semiconductor detector for X-ray radiation by controlling the actuator 81.

The membrane 61a, which is carried by the X-ray detector 47a in the exemplary embodiment illustrated in FIG. 7 can be omitted, while the detection efficiency of the semiconductor detector for electrons can still be changed by displacing the membrane 73 under the control of the actuator 81.

Figure 8:
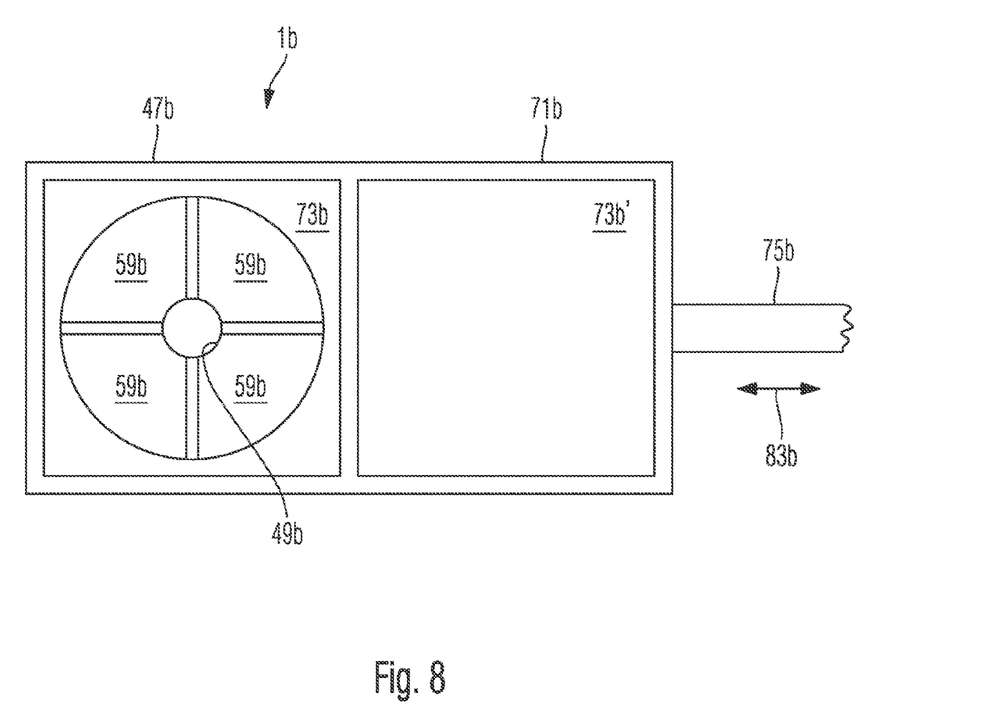
FIG. 8 is an elevational view from the bottom of a particle beam system.

FIG. 8 is a partial view of a further exemplary embodiment of a particle beam system, wherein the particle beam system 1b shown in FIG. 8 is similar to the particle system illustrated with reference to FIG. 7 above. FIG. 8 is an elevational view from the bottom of an X-ray detector 47b as it can be seen from an object plane (see reference numeral 23a in FIG. 7) of an objective lens of the particle beam system 1b. Membranes 73b and 73b' mounted on a carrier 71b can be selectively positioned in front of an X-ray detector 47b. The carrier 71b is mounted on a rod 75b which can be displaced by an actuator (not shown in FIG. 8) as indicated by a double arrow 83b in FIG. 8. The membranes 73b and 73b' differ with respect to a transmittance for secondary electrons. In the example shown in FIG. 8, the X-ray detector 47b includes four semiconductor detectors, wherein each of the semiconductor detectors has a detection surface 59b. An additional membrane can be provided in front of some or more of the detection surfaces. If two or more membranes are provided in front of the detection surfaces, they can also differ with respect to their transmittance for secondary electrons. It is also possible to provide a number of semiconductor detectors which is different than four. It is in particular possible, to provide only one single semiconductor detector while still providing the possibility of obtaining measurements at different transmittances for secondary electrons since different membranes 73b and 73b' are mounted on the carrier 71b. The membranes 73b and 73b' differ with respect to their secondary electron transmittances and can be selectively positioned in front of the X-ray detector.

In the embodiment shown in FIG. 8, it is also possible that only the membrane 73b is mounted on the carrier 71b while the membrane 73b is omitted. With such configuration it is still possible to obtain two measurements differing with respect to the secondary electron transmittance, if the carrier 71b is reciprocated between its two positions.

The one or more membranes mounted on the carrier in the embodiments illustrated with reference to FIGS. 7 and 8 above can be made of materials and thicknesses as illustrated with respect to the membranes 61 in the embodiments illustrated with reference to FIGS. 1 to 6 above.

It is further possible to arrange the motor providing the actuator within the wall 77 and inside the vacuum space.

It is further possible that the actuator is a manually operated actuator rather than an actuator operated by a motor.

In the embodiments illustrated above, the particle beam system is an electron beam system in which an electron beam is used as the primary particle beam for releasing electrons and X-rays from a sample. It is, however, also possible that an ion beam rather than the electron beam is used as the primary electron beam to release electrons and X-rays from the sample. Examples of suitable systems for generating an ion beam as the primary particle be are known from US 2007/0228287 A1 and US 2007/0215802 A1, wherein the full disclosure of these documents is incorporated herein by reference.

According to embodiments, there is provided a particle beam system comprising a particle beam source for generating a primary particle beam, an objective lens for focusing the primary particle beam, an electron detector and an X-ray detector. The X-ray detector comprises one or more semiconductor detectors having detection surfaces oriented towards a sample. One or more membranes can be selectively provided between the one or more detection surfaces and the sample. If two or more membranes are provided, they may differ with respect to a transmittance for secondary electrons.

While the invention has been described with respect to certain exemplary embodiments thereof, it is evident that many alternatives, modifications and variations will be apparent to those skilled in the art. Accordingly, the exemplary embodiments of the invention set forth herein are intended to be illustrative and not limiting in any way. Various changes may be made without departing from the spirit and scope of the present invention as defined in the following claims.

What is claimed is:

1. Particle beam system comprising:
   a particle beam source configured to generate a primary particle beam;
   an objective lens configured to focus the primary particle beam in an object plane;
   a particle detector; and
   an X-ray detector arranged between the objective lens and the object plane;
   wherein the X-ray detector comprises:
   first and second semiconductor detectors, each having a detection surface oriented towards the object plane;

a first membrane disposed between the object plane and the detection surface of the first semiconductor detector, and a second membrane disposed between the object plane and the detection surface of the second semiconductor detector, wherein a transmittance for electrons of the first membrane is greater than a transmittance for electrons of the second membrane.

2. The particle system according to claim 1, wherein the transmittance of the first membrane is greater than 0.5 for electrons having a kinetic energy of 12 keV, and wherein the transmittance of the second membrane is less than 0.3 for electrons having the kinetic energy of 12 keV.

3. The particle beam system according to claim 1, wherein the transmittance of the first membrane is greater than 0.5 for electrons having a kinetic energy of 8 keV, and wherein the transmittance of the second membrane is less than 0.3 for electrons having the kinetic energy of 8 keV.

4. The particle beam system according to claim 1, wherein a transmittance for X-rays of the first membrane is greater than 0.2 for X-rays having an energy of 0.5 keV, and wherein a transmittance for X-rays of the second membrane is less than 0.1 for X-rays having the energy of 0.5 keV.

5. The particle beam system according to claim 1, further comprising a controller having a signal processing module configured to determine measurement data based on detection signals generated by the first semiconductor detector and on detection signals generated by the second semiconductor detector.

6. The particle system according to claim 1, further comprising a deflector configured to direct the primary particle beam to different locations on the object plane.

7. The particle beam system according to claim 6, further comprising a controller having a control module configured to control the deflector such that the primary beam is scanned across a portion of the object plane and such that an image of an object is generated based on detection signals generated by the first and second semiconductor detectors.

8. The particle beam system according to claim 1, wherein the first and second semiconductor detectors are mounted on a ring structure surrounding a beam path of the primary particle beam.

9. The particle beam system according to claim 8, wherein three or more semiconductor detectors are mounted on the ring structure, and wherein two or more of the semiconductor detectors include a membrane located between the object plane and the respective semiconductor detector.

10. A particle beam system comprising:
a particle beam source configured to generate a primary particle beam;
an objective lens configured to focus the primary particle beam in an objective plane;
an electron detector; and
an X-ray detector arranged between the objective lens and the object plane, wherein the X-ray detector comprises a first semiconductor detector having a detection surface oriented towards the object plane,
wherein the particle beam system further comprises an actuator and a first membrane connected to the actuator, wherein the actuator is configured to reciprocate the first membrane between a first position in which a first membrane is located between the semiconductor detector and the object plane, and a second position in which the first membrane is not positioned between the semiconductor detector and the object plane.

11. The particle beam system according to claim 10, further comprising a second membrane coupled to the actuator such that the second membrane is not positioned between the semiconductor detector and the object plane when the first membrane is in its first position, and such that the second membrane is positioned between the semiconductor detector and the object plane when the first membrane is in the second position, and wherein a transmittance for electrons of the first membrane is greater than a transmittance for electrons of the second membrane.

12. The particle system according to claim 11, wherein the transmittance of the first membrane is greater than 0.5 for electrons having a kinetic energy of 12 keV, and wherein the transmittance of the second membrane is less than 0.3 for electrons having the kinetic energy of 12 keV.

13. The particle beam system according to claim 12, wherein the transmittance of the first membrane is greater than 0.5 for electrons having a kinetic energy of 8 keV, and wherein the transmittance of the second membrane is less than 0.3 for electrons having the kinetic energy of 8 keV.

14. The particle beam system according to claim 12, wherein a transmittance for X-rays of the first membrane is greater than 0.2 for X-rays having an energy of 0.5 keV, and wherein a transmittance for X-rays of the second membrane is less than 0.1 for X-rays having the energy of 0.5 keV.

15. The particle beam system according to one of claims 12 to 9, wherein, the semiconductor detector carries a third membrane located between the detection surface of the semiconductor detector and the object plane.

16. The particle beam system according to claim 10, further comprising a controller having a signal processing module configured to determine measurement data based on detection signals generated by the first semiconductor detector and on detection, signals generated by the second semiconductor detector.

17. The particle system according to claim 10, further comprising a deflector configured to direct the primary particle beam to different locations on the object plane.

18. The particle beam system according to claim 17, further comprising a controller having a control module configured to control the deflector such that the primary beam is scanned across a portion of the object plane and such that an image of an object is generated based on detection signals generated by the first and second semiconductor detectors.

19. The particle beam system according to claim 10, wherein the first and second semiconductor detectors are mounted on a ring structure surrounding a beam path of the primary particle beam.

20. The particle beam system according to claim 19, wherein three or more semiconductor detectors are mounted on the ring structure, and wherein two or more of the semiconductor detectors include a membrane located between the object plane and the respective semiconductor detector.

* * * * *

UNITED STATES PATENT AND TRADEMARK OFFICE
CERTIFICATE OF CORRECTION

| | | Page 1 of 1 |
|---|---|---|
| PATENT NO. | : 8,368,019 B2 | |
| APPLICATION NO. | : 13/247979 | |
| DATED | : February 5, 2013 | |
| INVENTOR(S) | : Hubert Mantz et al. | |

It is certified that error appears in the above-identified patent and that said Letters Patent is hereby corrected as shown below:

In the Specifications

Column 2, line 43, "IP-ray" should read --X-ray--

Column 3, line 52, "or" should read --count--

Column 4, line 7, "objective, lens" should read --objective lens--

Column 4, line 42, "incident, on" should read --incident on--

Column 4, line 46, "incident, on" should read --incident on--

Column 4, line 49, "lee" should read --the--

Column 5, line 43, "detectors" should read --detectors 57--

Column 7, line 10, "61" should read --61'--

Column 7, line 60, "73b" should read --73b'--

Column 8, line 13, "73b" should read --73b'--

Column 8, line 33, "be" should read --beam--

In the Claims

Column 10, line 39, "detection, signals" should read --detection signals--

Signed and Sealed this
Fourteenth Day of May, 2013

Teresa Stanek Rea
*Acting Director of the United States Patent and Trademark Office*